(12) United States Patent
Shirai

(10) Patent No.: US 7,876,418 B2
(45) Date of Patent: Jan. 25, 2011

(54) OPTICAL ELEMENT AND PROJECTION EXPOSURE APPARATUS BASED ON USE OF THE OPTICAL ELEMENT

(75) Inventor: Takeshi Shirai, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 11/147,284

(22) Filed: Jun. 8, 2005

(65) Prior Publication Data

US 2005/0225738 A1 Oct. 13, 2005

Related U.S. Application Data

(63) Continuation of application No. PCT/JP03/015780, filed on Dec. 10, 2003.

(30) Foreign Application Priority Data

Dec. 10, 2002 (JP) ............................. 2002-357641

(51) Int. Cl.
G03B 27/42 (2006.01)

(52) U.S. Cl. ..................................................... 355/53

(58) Field of Classification Search .................. 355/53, 355/55, 67; 428/446, 697; 250/548; 359/649, 359/580; 427/508
See application file for complete search history.

(56) References Cited

U.S. PATENT DOCUMENTS

| | | |
|---|---|---|
| 3,706,485 A | 12/1972 | Fawcett et al. |
| 4,346,164 A | 8/1982 | Tabarelli et al. |
| 4,480,910 A | 11/1984 | Takanashi et al. |
| 4,500,611 A | 2/1985 | Nickol et al. |
| 4,568,140 A | 2/1986 | van der Werf et al. |
| 4,954,372 A | 9/1990 | Sako et al. |
| 5,067,781 A | 11/1991 | Montanari et al. |
| 5,139,879 A | 8/1992 | Aharoni et al. |
| 5,494,743 A | 2/1996 | Woodard et al. |
| 5,610,683 A | 3/1997 | Takahashi |

(Continued)

FOREIGN PATENT DOCUMENTS

DE 221 563 A1 4/1985

(Continued)

OTHER PUBLICATIONS

M. Switkes et al., "Immersion Liquids for Lithography in the Deep Ultraviolet", Optical Microlithography XVI, 2003, pp. 690-699, vol. 5040.

(Continued)

Primary Examiner—Peter B Kim
(74) Attorney, Agent, or Firm—Oliff & Berridge, PLC

(57) ABSTRACT

A liquid immersion exposure apparatus includes a projection optical system (PL) which projects an image of a pattern onto a substrate (W) and a unit (5) which supplies a liquid (7) between an optical element (4) at the end of the projection optical system (PL) and the substrate (W). A corrosion-resistant film composed of an oxide is formed on the surface of the optical element (4) to prevent corrosion by the liquid (7). Consequently, a desired performance of the projection optical system can be secured for a long time even where a full field exposure in the step-and-repeat manner or a scanning exposure in the step-and-scan manner is performed in a liquid-immersion state.

50 Claims, 8 Drawing Sheets

U.S. PATENT DOCUMENTS

| | | | |
|---|---|---|---|
| 5,648,860 A | 7/1997 | Ooi et al. | |
| 5,715,039 A * | 2/1998 | Fukuda et al. | 355/53 |
| 5,825,043 A | 10/1998 | Suwa | |
| 5,882,773 A | 3/1999 | Chow et al. | |
| 5,962,079 A * | 10/1999 | Koberstein et al. | 427/508 |
| 5,993,898 A | 11/1999 | Nagatsuka | |
| 6,084,846 A | 7/2000 | Jordache et al. | |
| 6,166,855 A | 12/2000 | Ikeyama et al. | |
| 6,191,429 B1 * | 2/2001 | Suwa | 250/548 |
| 6,417,974 B1 | 7/2002 | Schuster | |
| 6,556,353 B2 | 4/2003 | Omura | |
| 6,574,039 B1 | 6/2003 | Murata et al. | |
| 6,628,574 B1 | 9/2003 | Shimazaki et al. | |
| 6,867,844 B2 | 3/2005 | Vogel et al. | |
| 6,914,665 B2 | 7/2005 | Ishikawa | |
| 7,129,009 B2 | 10/2006 | French et al. | |
| 7,393,469 B2 | 7/2008 | Benrashid et al. | |
| 2001/0043320 A1 | 11/2001 | Kato et al. | |
| 2002/0005990 A1 | 1/2002 | Watanabe | |
| 2003/0030916 A1 | 2/2003 | Suenaga | |
| 2003/0142409 A1 * | 7/2003 | Ohtsu et al. | 359/619 |
| 2004/0075895 A1 * | 4/2004 | Lin | 359/380 |
| 2004/0119954 A1 | 6/2004 | Kawashima et al. | |
| 2004/0165159 A1 | 8/2004 | Lof et al. | |
| 2005/0007567 A1 | 1/2005 | Pierrat et al. | |
| 2005/0094119 A1 | 5/2005 | Loopstra et al. | |
| 2005/0100745 A1 * | 5/2005 | Lin et al. | 428/446 |
| 2005/0213066 A1 | 9/2005 | Sumiyoshi | |
| 2005/0225737 A1 | 10/2005 | Weissenrieder et al. | |
| 2005/0225738 A1 | 10/2005 | Shirai | |
| 2005/0237504 A1 | 10/2005 | Nagasaka et al. | |
| 2005/0248856 A1 | 11/2005 | Omura et al. | |
| 2006/0087725 A1 | 4/2006 | Arriola | |
| 2006/0203218 A1 * | 9/2006 | Shirai et al. | 355/53 |
| 2007/0188879 A1 | 8/2007 | Ikezawa et al. | |
| 2007/0201011 A1 | 8/2007 | Kokubun et al. | |

FOREIGN PATENT DOCUMENTS

| | | |
|---|---|---|
| DE | 224 448 A1 | 7/1985 |
| EP | 0 834 773 A2 | 4/1998 |
| EP | 1 152 263 A1 | 11/2001 |
| EP | 1 172 670 A2 | 1/2002 |
| EP | 1 510 871 A2 | 3/2005 |
| EP | 1 571 700 A1 | 9/2005 |
| EP | 1 646 074 A1 | 4/2006 |
| JP | A-57-153433 | 9/1982 |
| JP | A-58-202448 | 11/1983 |
| JP | A-59-19912 | 2/1984 |
| JP | A-62-65326 | 3/1987 |
| JP | A-62-121417 | 6/1987 |
| JP | A-63-157419 | 6/1988 |
| JP | A-4-305915 | 10/1992 |
| JP | A-04-305915 | 10/1992 |
| JP | A-4-305917 | 10/1992 |
| JP | A-04-305917 | 10/1992 |
| JP | A-05-62877 | 3/1993 |
| JP | A-5-62877 | 3/1993 |
| JP | A-6-124873 | 5/1994 |
| JP | A-07-220990 | 8/1995 |
| JP | A-7-220990 | 8/1995 |
| JP | A-8-316125 | 11/1996 |
| JP | A. 10-154659 | 6/1998 |
| JP | A 10-154659 | 6/1998 |
| JP | A-10-163099 | 6/1998 |
| JP | A-10-214783 | 8/1998 |
| JP | A-10-303114 | 11/1998 |
| JP | A-10-340846 | 12/1998 |
| JP | A-11-176727 | 7/1999 |
| JP | A-11-264903 | 9/1999 |
| JP | A-2000-58436 | 2/2000 |
| JP | A 2000-58436 | 2/2000 |
| JP | A-2000-131503 | 5/2000 |
| JP | A-2000-505958 | 5/2000 |
| JP | A 2001-91849 | 4/2001 |
| JP | A-2002-244035 | 8/2002 |
| JP | A-2004-207711 | 7/2004 |
| JP | A-2004-259966 | 9/2004 |
| WO | WO 98/28665 | 7/1998 |
| WO | WO99/49504 | 9/1999 |
| WO | WO 2004/019128 A2 | 3/2004 |
| WO | WO 2004/053950 A1 | 6/2004 |
| WO | WO 2004/053951 A1 | 6/2004 |
| WO | WO 2004/107048 A2 | 12/2004 |

OTHER PUBLICATIONS

Aug. 13, 2007 Supplementary European Search Report in European Application No. 03 77 8771.
Apr. 28, 2010 Office Action in U.S. Appl. No. 11/416,110.
Jan. 7, 2010 Office Action in U.S. Appl. No. 11/416,110.
Feb. 1, 2010 Office Action in U.S. Appl. No. 11,546,298.
Aug. 3, 2006 Office Action in U.S. Appl. No. 11/416,110.
Jan. 29, 2007 Office Action in U.S. Appl. No. 11/416,110.
Jul. 26, 2007 Office Action in U.S. Appl. No. 11/416,110.
Apr. 4, 2008 Office Action in U.S. Appl. No. 11/416,110.
Mar. 4, 2009 Office Action in U.S. Appl. No. 11/416,110.
Jun. 19, 2009 Office Action in U.S. Appl. No. 11/546,298.

* cited by examiner

OPTICAL ELEMENT AND PROJECTION EXPOSURE APPARATUS BASED ON USE OF THE OPTICAL ELEMENT

CROSS-REFERENCE

This application is a Continuation Application of International Application No. PCT/JP03/015780 which was filed on Dec. 10, 2003 claiming the conventional priority of Japanese patent Application No. 2002-357641 filed on Dec. 10, 2002.

BACKGROUND OF THE INVENTION

1. Field of the Invention

The present invention relates to a projection exposure apparatus which is usable to transfer a mask pattern onto a photosensitive substrate in the lithography step for producing devices including, for example, semiconductor elements, image pickup elements (CCD or the like), liquid crystal display elements, and thin film magnetic heads. In particular, the present invention relates to a projection exposure apparatus based on the use of the liquid immersion method. The present invention also relates to an optical element which is usable for the projection exposure apparatus.

2. Description of the Related Art

In the production of the semiconductor element or the like, the projection exposure apparatus is used to transfer a pattern image of a reticle as a mask via a projection optical system onto each of shot areas on a wafer (or a glass plate or the like) coated with a resist as a photosensitive substrate. Conventionally, the reduction projection type exposure apparatus based on the step-and-repeat system (stepper) has been used as the projection exposure apparatus in many cases. However, recently, the attention is also attracted to the projection exposure apparatus based on the step-and-scan system in which the exposure is performed by synchronously scanning the reticle and the wafer.

As for the resolution of the projection optical system carried on the projection exposure apparatus, as the exposure wavelength to be used is shorter, the resolution becomes higher. Further, as the numerical aperture of the projection optical system is larger, the resolution becomes higher. Therefore, the exposure wavelength, which is used for the projection exposure apparatus, is shortened year by year, and the numerical aperture of the projection optical system is increased as well, as the integrated circuit becomes fine and minute. The exposure wavelength, which is dominantly used at present, is 248 nm based on the KrF excimer laser. However, the exposure wavelength of 193 nm based on the ArF excimer laser, which is shorter than the above, is also practically used.

When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and k1 and k2 represent the process coefficients. According to the expressions (1) and (2), the following fact is appreciated. That is, when the exposure wavelength λ is shortened and the numerical aperture NA is increased in order to enhance the resolution R, then the depth of focus δ is narrowed. Conventionally, in the projection exposure apparatus, the surface of the wafer is adjusted and matched with the image plane of the projection optical system in the autofocus manner. For this purpose, it is desirable that the depth of focus δ is wide to some extent. Accordingly, those having been suggested as the method for substantially widening the depth of focus include, for example, the phase shift reticle method, the modified illumination method, and the multilayer resist method.

As described above, in the conventional projection exposure apparatus, the depth of focus is narrowed as the wavelength of the exposure light beam is shortened and the numerical aperture of the projection optical system is increased. In order to respond to the advance of higher integration of the semiconductor integrated circuit, studies have been also made to further shorten the exposure wavelength. However, if such a situation is continued as it is, it is feared that the depth of focus may be too narrowed and the margin may become insufficient during the exposure operation.

In view of the above, the liquid immersion method has been proposed as a method for substantially shortening the exposure wavelength and deepening the depth of focus. In this method, the space between the lower surface of the projection optical system and the surface of the wafer is filled with a liquid such as water or an organic solvent. The resolution is improved and the depth of focus is magnified about n times by utilizing the fact that the wavelength of the exposure light beam in the liquid is 1/n time that in the air (n represents the refractive index of the liquid, which is usually about 1.2 to 1.6).

If it is intended to apply the liquid immersion method to the projection exposure apparatus based on the step-and-repeat system as it is, the liquid leaks out from the space between the projection optical system and the wafer when the wafer is subjected to the stepping movement to the next shot area after the exposure is completed for one shot area. Therefore, inconveniences arise such that the liquid must be supplied again, and it is difficult to recover the leaked liquid as well. If it is intended to apply the liquid immersion method to the projection exposure apparatus based on the step-and-scan system, it is necessary that the space between the projection optical system and the wafer is filled with the liquid during the period in which the wafer is moved as well, because the exposure is performed while moving the wafer. The projection optical system and the liquid make contact with each other. Therefore, there is such a possibility that the end portion of the projection optical system, which is in contact with the liquid, may be corroded by the liquid. The objective lens is installed to the end of the projection optical system. If the objective lens is corroded, it is feared that any desired optical performance cannot be obtained.

SUMMARY OF THE INVENTION

Taking the foregoing viewpoints into consideration, an object of the present invention is to provide an optical element which is preferably usable for a projection exposure system of an exposure apparatus for performing the liquid immersion exposure. Another object of the present invention is to provide a projection exposure apparatus for the liquid immersion exposure which carries such an optical element.

According to a first aspect of the present invention, there is provided an optical element usable for a projection optical system which exposes a substrate by projecting a predetermined pattern onto the substrate, the optical element comprising:

a base of the optical element which is installed to an end of the projection optical system on a side of the substrate and through which the exposure is performed in a state that a liquid is maintained between the optical element and the substrate; and a corrosion resistant film which is formed on at least a part of a surface of the base of the optical element to avoid corrosion by the liquid.

The corrosion resistant film is formed on the surface of the base of the optical element of the present invention. Therefore, even when the liquid immersion exposure is performed, it is possible to avoid, for example, the corrosion, the erosion, and the dissolution which would be otherwise cause by the contact between the optical element and the liquid. Therefore, the desired performance of the projection optical system can be maintained over a long term even when the full field exposure such as those in the step-and-repeat manner or the scanning type exposure such as those in the step-and-scan manner, in which the optical element installed to the end of the projection optical system is exposed to the liquid repeatedly or continuously, is performed in the liquid immersion state.

According to a second aspect of the present invention, there is provided an exposure apparatus which exposes a substrate by projecting an image of a predetermined pattern onto the substrate through a liquid, the exposure apparatus comprising:

a projection optical system which projects the image of the pattern onto the substrate;

an optical element which is installed to an end of the projection optical system on a side of the substrate; and an apparatus which supplies the liquid to a space between the optical element and the substrate, wherein:

the optical element includes a base, and a corrosion resistant film which is formed on at least a part of a surface of the base to avoid corrosion of the base.

The corrosion resistant film is formed on the surface of the base of the optical element installed to the tip of the projection optical system of the exposure apparatus of the present invention. Therefore, even when the liquid immersion exposure is performed, it is possible to avoid, for example, the corrosion, the erosion, and the dissolution which would be otherwise cause by the contact between the optical element and the liquid. Therefore, the desired optical characteristics of the exposure apparatus can be maintained over a long term even when the full field exposure such as those based on the step-and-repeat system or the scanning type exposure such as those based on the step-and-scan system, in which the optical element installed to the end of the projection optical system is exposed to the liquid repeatedly or continuously, is performed in the liquid immersion state. Accordingly, it is possible to realize the exposure in a state in which the wide depth of focus is maintained.

DESCRIPTION OF THE PREFERRED EMBODIMENTS OF THE INVENTION

An explanation will be made below with reference to the drawings about embodiments of the optical element of the present invention and the projection exposure apparatus based on the use of the optical element. However, the present invention is not limited thereto.

Figure 8:
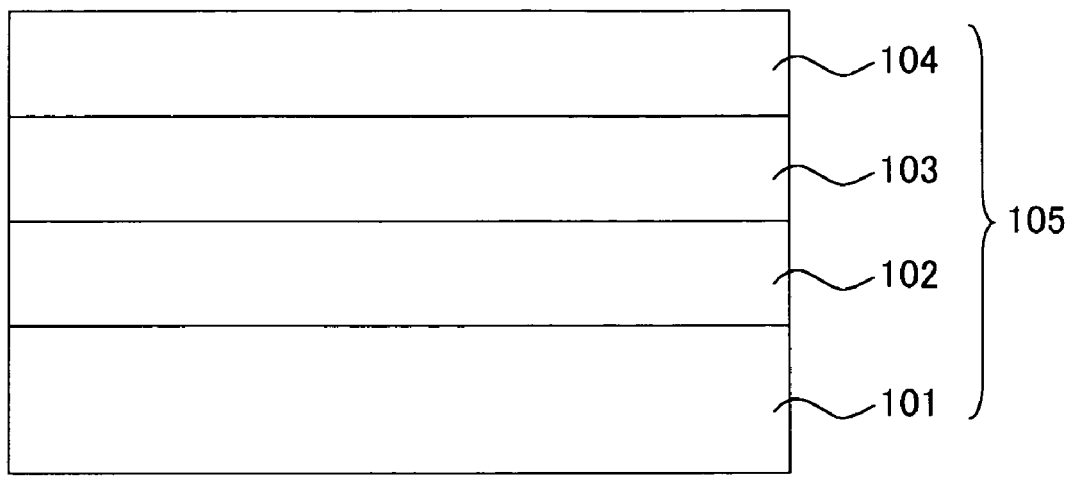
FIG. 8 shows a schematic arrangement of the optical element of the present invention.

At first, the optical element of the present invention will be explained with reference to FIGS. 8 to 10. FIG. 8 shows a cross-sectional structure of an optical element 105 of the present invention. The optical element 105 includes an $SiO_2$ layer 102, an $Al_2O_3$ layer 103, and an $SiO_2$ layer 104 which are stacked in this order on a fluorite ($CaF_2$) base 101. These layers or the an $SiO_2$ layer disposed on the outermost surface functions as the corrosion resistant film (erosion resistant film). The fluorite base 101 is formed to be lens-shaped, and it has a thickness of 20 mm. The $SiO_2$ layer 102, the $Al_2O_3$ layer 103, and the $SiO_2$ layer 104 are formed so that the optical thicknesses are $0.37\lambda$, $0.05\lambda$, and $0.37\lambda$ with respect to the designed main wavelength $\lambda$ (for example, $\lambda=193$ nm) respectively. A known sputtering method was used for each of the layers so that the dense film was successfully formed. The film formation method is not limited to the sputtering method. It is also allowable to use, for example, the ion beam assist method, the ion plating method, and the heating vapor deposition method provided that the dense film can be formed. The corrosion resistant films as described above may be provided on the both sides of the base 101 respectively. Alternatively, the corrosion resistant film as described above may be provided at only the portion of the base 101 to be irradiated with the light beam.

Investigation of Reflectance Characteristics

The reflectance characteristics were investigated in relation to the angle of incidence of the light beam into the optical element 105 obtained as described above. In order to make comparison with the optical element 105 (hereinafter referred to as "optical element A"), a fluorite base stacked with neither the SiO₂ layer nor the Al₂O₃ layer, i.e., an optical element composed of only the fluorite base (hereinafter referred to as "optical element B") was prepared. The ArF excimer laser beam having a wavelength of 193 nm, which was used as the exposure light beam for the exposure apparatus, was radiated onto the optical element A and the optical element B respectively while changing the angle of incidence to measure the reflectances. Obtained results are shown in FIGS. 9 and 10. The reflected light beams were measured for the S-polarized light and the P-polarized light which were orthogonal to one another.

Figure 9:
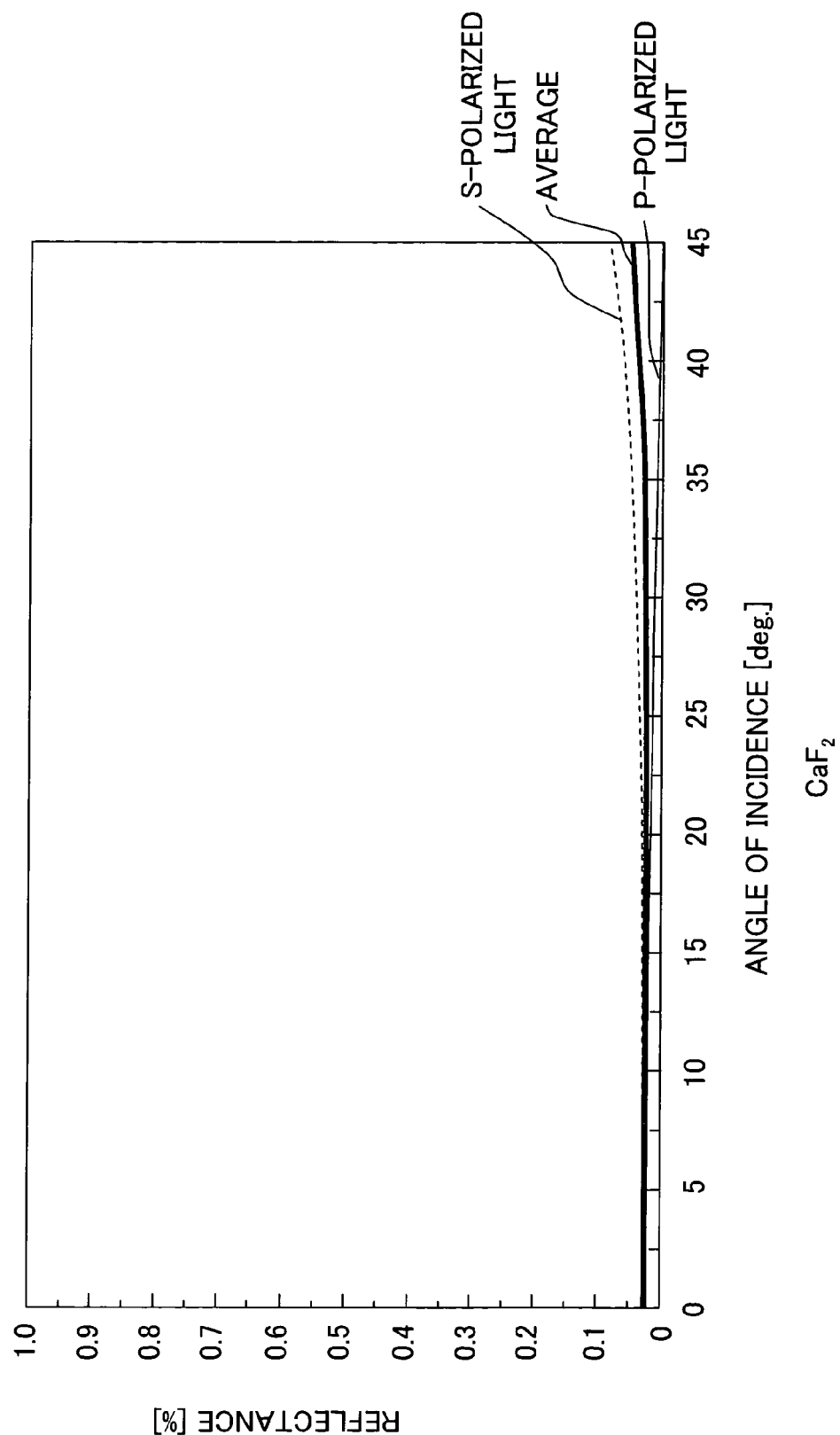
FIG. 9 shows a relationship between the angle of incidence and the reflectance of the ArF excimer laser (wavelength: 193 nm) when an optical element is constructed by only fluorite.

FIG. 9 shows a graph illustrating the reflectance characteristic of the optical element B with respect to the angle of incidence. As shown in FIG. 9, the average reflectance of the S-polarized light and the P-polarized light in relation to the optical element B was not more than about 0.04% in all regions ranging to the maximum angle of incidence of 40 degrees in which the optical element was to be used.

Figure 10:
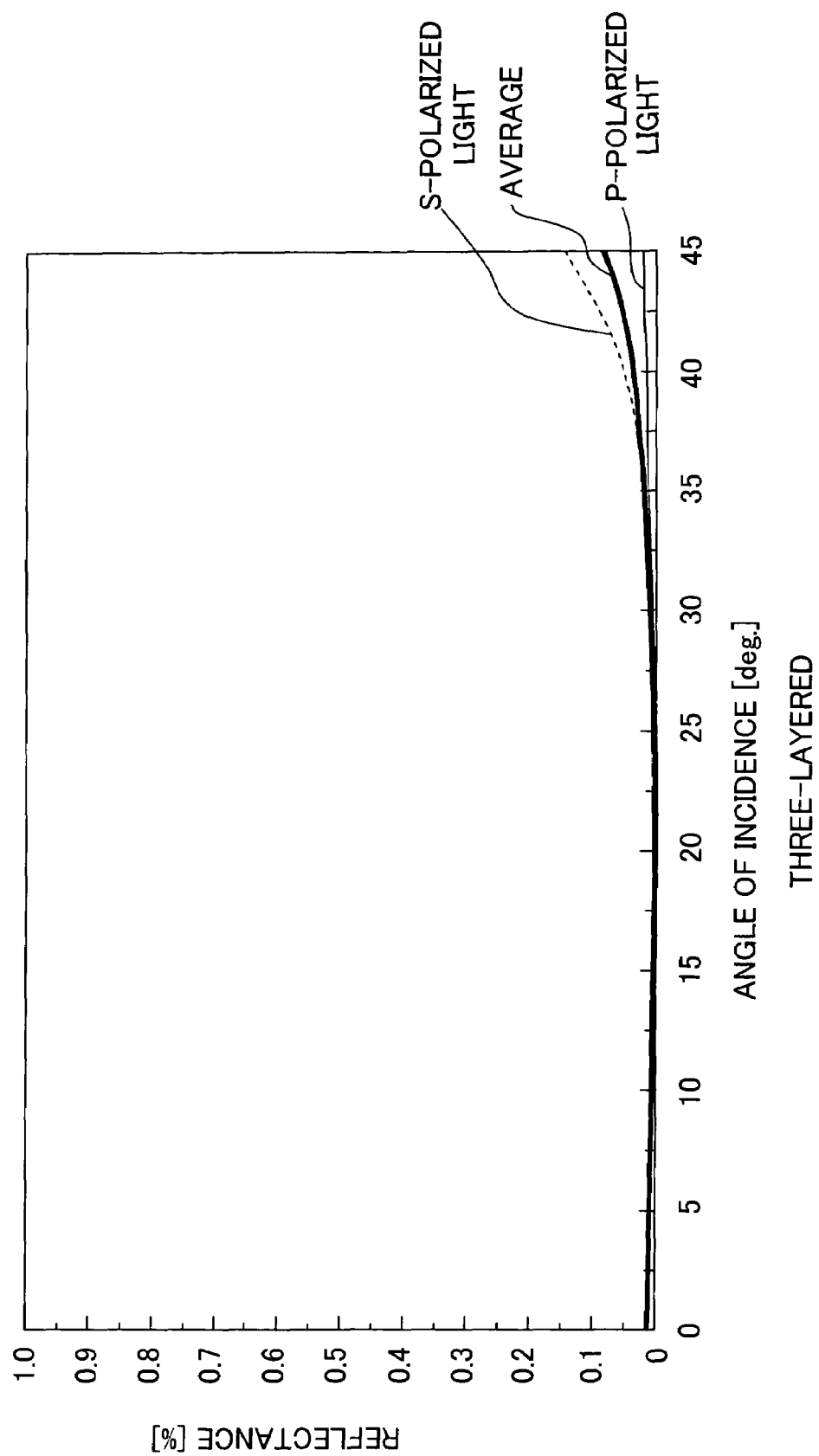
FIG. 10 shows a relationship between the angle of incidence and the reflectance of the ArF excimer laser (wavelength: 193 nm) when an optical element 105 has respective layers formed on a fluorite base.

FIG. 10 shows a graph illustrating the reflectance characteristic of the optical element A with respect to the angle of incidence. As shown in FIG. 10, the average reflectance of the S-polarized light and the P-polarized light was not more than about 0.04% in all regions ranging to the maximum angle of incidence of 40 degrees in which the optical element was to be used.

That is, the optical element A exhibits the low values of the average reflectance of the S-polarized light and the P-polarized light in all regions of the angle of incidence assumed for the use as the optical element, in the same manner as the optical element B composed of only fluorite. It is appreciated that the optical element A can be carried at the end portion of the projection optical system of the projection exposure apparatus in place of the optical element B.

Evaluation of Corrosion Resistance

Next, an acceleration test was carried out for the corrosion resistance by immersing the optical element A and the optical element B in pure water at 70° C. for 3 hours respectively. The surface roughnesses of the optical elements were measured by using an AFM (atomic force microscope) and a contact type roughness meter. It is assumed that the immersion in pure water at 70° C. for 3 hours corresponds to the immersion in pure water at room temperature for about 10 days.

The surface roughness, which was obtained before immersing the optical element B composed of only fluorite in pure water, was 3 angstrom RMS. The surface roughness, which was obtained after immersing the optical element B in pure water, was about 3,000 angstrom RMS. Therefore, it is understood that the optical element B was corroded to have the about 1,000 times surface roughness. When the surface roughness of the surface of the optical element is 3,000 angstrom RMS as described above, the scattering of light is caused to a large extent. Therefore, the transmittance of the optical element is lowered, and any deviation arises from the designed optical path. Therefore, it is impossible to exhibit any intended desired optical performance.

On the other hand, the surface roughness of the optical element A according to the present invention before being immersed in pure water was 11 angstrom RMS. The surface roughness of the optical element after being immersed in pure water was 14 angstrom RMS. Therefore, it is appreciated that the surface roughness of the optical element is scarcely changed before and after being immersed in pure water. Therefore, the optical element A can maintain the desired optical performance after being immersed in pure water, i.e., even when the liquid immersion exposure is performed, probably for the following reason. That is, it is considered that the oxide coating film, which is formed on the surface of the fluorite base, prevents the fluorite base from corrosion, because the oxide coating film has the corrosion resistance against pure water.

In the optical element A of this embodiment, the three-layered multilayer film composed of the oxides is formed on the fluorite base. However, it has been revealed that the same or equivalent effect is obtained even when a single layer film of, for example, $SiO_2$ (optical film thickness: $0.55\lambda$) or $Al_2O_3$ is formed. The film thickness of the multilayer film or the single layer film having the corrosion resistance is not specifically limited. However, it is desirable that the film thickness is 50 angstroms to 2,000 angstroms in view of the fact that the covering performance of the film on the surface of the fluorite base is secured, and the angular reflection-preventive performance (anti-reflection function) is secured.

In this embodiment, the $SiO_2$ layer and the $Al_2O_3$ layer are formed on the fluorite base. However, in place of these layers or together with these layers, a layer or layers of fluoride or fluorides such as $YF_3$, $MgF_2$, and $LaF_3$ may be formed singly or in combination.

Next, an explanation will be made with reference to FIGS. 1 to 4 about a second embodiment illustrative of a projection exposure apparatus to which the optical element of the embodiment described above is applied. The projection exposure apparatus of this embodiment is a projection exposure apparatus based on the step-and-repeat system for performing the full field exposure for the shot area on the substrate.

Figure 1:
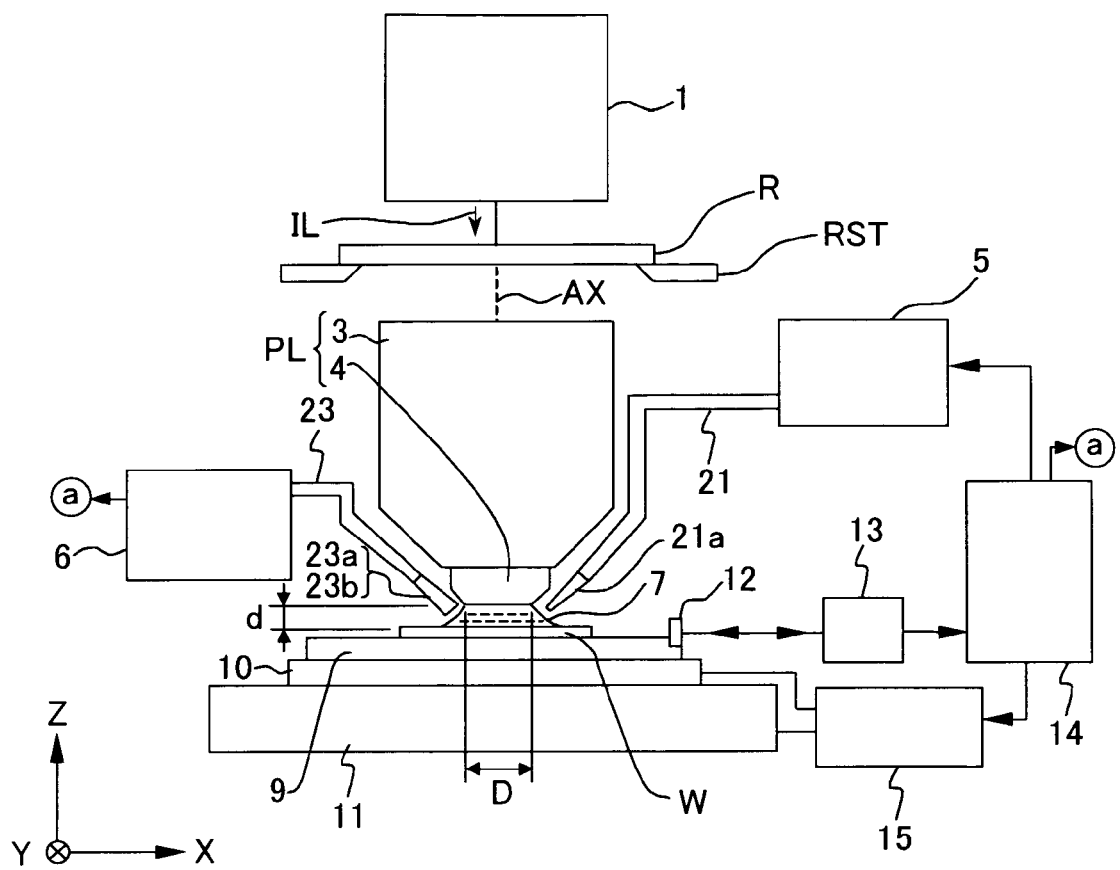
FIG. 1 shows a schematic arrangement of a projection exposure apparatus according to the present invention.

FIG. 1 shows a schematic arrangement of the projection exposure apparatus of this embodiment. With reference to FIG. 1, the exposure light beam IL, which is composed of an ultraviolet pulse light beam having a wavelength of 193 nm, is radiated from an illumination optical system 1 including, for example, an ArF excimer laser light source as an exposure light source, an optical integrator (homogenizer), a field diaphragm, and a condenser lens. The exposure light beam IL illuminates a pattern provided on a reticle R. The pattern of the reticle R is subjected to the reduction projection onto an exposure area on a wafer W coated with a photoresist at a predetermined projection magnification $\beta$ ($\beta$ is, for example, ¼ or ⅕) via a projection optical system PL which is telecentric on the both sides (or on one side of the wafer W). Those usable as the exposure light beam IL also include, for example, the KrF excimer laser beam (wavelength: 248 nm), the $F_2$ laser beam (wavelength: 157 nm), and the i-ray (wavelength: 365 nm) of the mercury lamp.

In the following description, it is assumed that the Z axis extends in the direction parallel to the optical axis AX of the projection optical system PL, the Y axis extends in the direction perpendicular to the sheet surface of FIG. 1 in the plane perpendicular to the Z axis, and the X axis extends in parallel to the sheet surface of FIG. 1.

The reticle R is held on a reticle stage RST. A mechanism, which finely moves the reticle R in the X direction, the Y direction, and the rotational direction, is incorporated in the reticle stage RST. The two-dimensional position and the angle of rotation of the reticle stage RST are measured in real-time by a laser interferometer (not shown). A main control system 14 positions the reticle R on the basis of the value measured by the laser interferometer.

On the other hand, the wafer W is fixed on a Z stage 9 which controls the focus position (position in the Z direction) and the angle of inclination of the wafer W by the aid of a wafer holder (not shown). The Z stage 9 is fixed on an XY stage 10 which is movable along the XY plane that is substantially parallel to the image plane of the projection optical system PL. The XY stage 10 is placed on a base 11. The Z stage 9 controls the focus position (position in the Z direction) and the angle of inclination of the wafer W to adjust and match the surface of the wafer W with respect to the image plane of the projection optical system PL in the auto-focus manner and the auto-leveling manner. The XY stage 10 positions the wafer W in the X direction and the Y direction. The two-dimensional position and the angle of rotation of the Z stage 9 (wafer W) are measured in real-time as a position of a movement mirror 12 by a laser interferometer 13. The control information is fed from the main control system 14 to a wafer stage-driving system 15 on the basis of the measured result. The wafer stage-driving system 15 controls the operation of the Z stage 9 and the XY stage 10 on the basis of the control information. During the exposure, the operation, in which each of the shot areas on the wafer W is successively subjected to the stepping movement to the exposure position to perform the exposure with the pattern image of the reticle R, is repeated in the step-and-repeat manner.

The liquid immersion method is applied to the projection exposure apparatus of this embodiment in order that that the resolution is improved by substantially shortening the exposure wavelength, and the depth of focus is substantially widened. Therefore, the space between the surface of the wafer W and the tip surface (lower surface) of the projection optical system PL is filled with a predetermined liquid 7 at least during the period in which the pattern image of the reticle R is transferred onto the wafer W. The projection optical system PL has a plurality of optical elements which include the optical element 4 as produced in the embodiment described above, and a barrel 3 which accommodates the optical elements. The optical element 4 is installed so that the optical element 4 is exposed at the end (lower end) of the barrel on the side of the wafer (see FIGS. 4 and 5). When the optical element 4 is installed as described above, only the optical element 4 makes contact with the liquid 7. Accordingly, the barrel 3, which is composed of metal, is prevented from the corrosion or the like. In this embodiment, pure water is used as the liquid 7. Pure water is advantageous in that pure water is available in a large amount with ease, for example, in the semiconductor production factory, and pure water exerts no harmful influence, for example, on the optical lens and the photoresist on the wafer. Further, pure water exerts no harmful influence on the environment, and the content of impurity is extremely low. Therefore, it is also expected to obtain the function to wash the surface of the wafer.

It is approved that the refractive index n of pure water (water) with respect to the exposure light beam having a wavelength of about 200 nm is approximately in an extent of 1.44 to 1.47. The wavelength of the ArF excimer laser beam of 193 nm is shortened on the wafer W by 1/n, i.e., to about 131 to 134 nm, and a high resolution is obtained. Further, the depth of focus is magnified about n times, i.e., about 1.44 to 1.47 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

The liquid 7 is supplied in a temperature-controlled state onto the wafer W by the aid of predetermined discharge nozzles or the like by a liquid supply unit 5 including, for example, a tank for accommodating the liquid, a pressurizing pump, and a temperature control unit. The liquid 7, which has been supplied onto the wafer W, is recovered by the aid of predetermined inflow nozzles or the like by a liquid recovery unit 6 including, for example, a tank for accommodating the liquid, and a suction pump. The temperature of the liquid 7 is set, for example, to be approximately equivalent to the temperature of a chamber in which the projection exposure apparatus of this embodiment is accommodated. The projection exposure apparatus of this embodiment is arranged with a discharge nozzle 21a having a thin tip section and two inflow nozzles 23a, 23b having wide tip sections so that the end portion of the optical element 4 of the projection optical system PL is interposed in the X direction (see FIG. 2). The discharge nozzle 21a is connected to the liquid supply unit 5 via a supply tube 21, and the inflow nozzles 23a, 23b are connected to the liquid recovery unit 6 via a recovery tube 23. Further, another set of discharge and recovery nozzles are arranged at positions obtained by rotating the positions of the set of the discharge nozzle 21a and the inflow nozzles 23a, 23b by substantially 180° about the center of the end portion of the optical element 4, and two sets of discharge and recovery nozzles are also arranged so that the end portion of the optical element 4 is interposed in the Y direction (see FIGS. 2 and 3).

Figure 2:
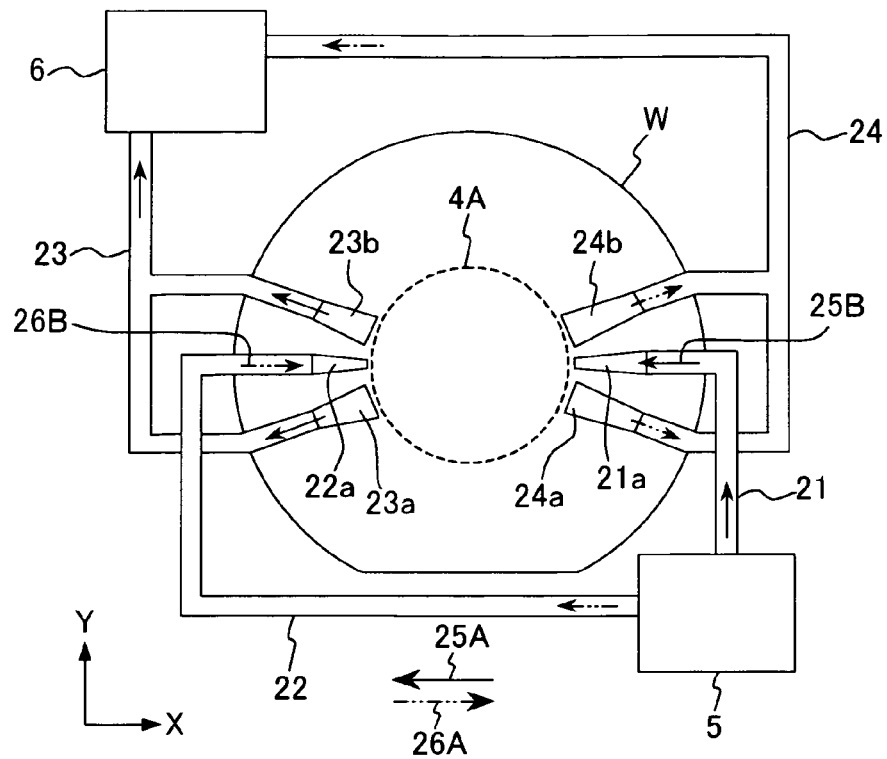
FIG. 2 shows a positional relationship between an end portion 4A of an optical element 4 of a projection optical system PL shown in FIG. 1 and discharge nozzles and inflow nozzles for the X direction.

FIG. 2 shows a positional relationship in relation to the end portion 4A of the optical element 4 of the projection optical system PL shown in FIG. 1, the wafer W, and the two sets of the discharge nozzles and the inflow nozzles to interpose the end portion 4A in the X direction. With reference to FIG. 2, the discharge nozzle 21a is arranged on the side in the +X direction with respect to the end portion 4A, and the inflow nozzles 23a, 23b are arranged on the side in the −X direction. The inflow nozzles 23a, 23b are arranged in a sector-shaped open form with respect to the axis which passes through the center of the end portion 4A and which is parallel to the X axis. Another set of the discharge nozzle 22a and the inflow nozzles 24a, 24b are arranged at the positions obtained by rotating the positions of the set of the discharge nozzle 21a and the inflow nozzles 23a, 23b by substantially 180° about the center of the end portion 4A. The discharge nozzle 22a is connected to the liquid supply unit 5 via a supply tube 22, and the inflow nozzles 24a, 24b are connected to the liquid recovery unit 6 via a recovery tube 24.

Figure 3:
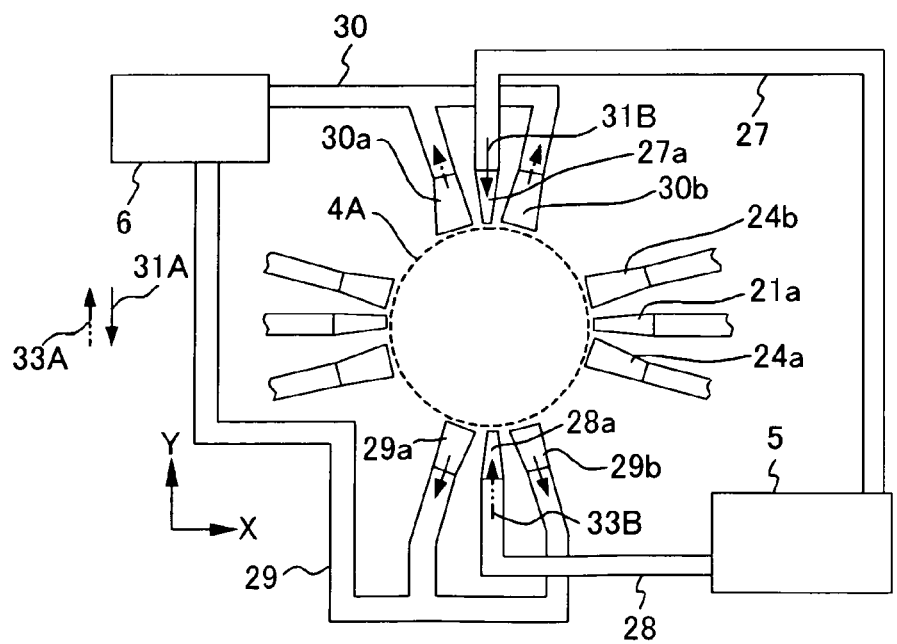
FIG. 3 shows a positional relationship between the end portion 4A of the optical element 4 of the projection optical system PL shown in FIG. 1 and discharge nozzles and inflow nozzles for supplying and recovering the liquid in the Y direction.

FIG. 3 shows a positional relationship in relation to the end portion 4A of the optical element 4 of the projection optical system PL shown in FIG. 1 and the two sets of the discharge nozzles and the inflow nozzles to interpose the end portion 4A in the Y direction. With reference to FIG. 3, the discharge nozzle 27a is arranged on the side in the +Y direction with respect to the end portion 4A, and the inflow nozzles 29a, 29b are arranged on the side in the −Y direction. The discharge nozzle 27a is connected to the liquid supply unit 5 via a supply tube 27, and the inflow nozzles 29a, 29b are connected to the liquid recovery unit 6 via a recovery tube 29. Another set of the discharge nozzle 28a and the inflow nozzles 30a, 30b are arranged at the positions obtained by rotating the positions of the set of the discharge nozzle 27a and the inflow nozzles 29a, 29b by substantially 180° about the center of the end portion 4A. The discharge nozzle 28a is connected to the liquid supply unit 5 via a supply tube 28, and the inflow nozzles 30a, 30b are connected to the liquid recovery unit 6 via a recovery tube 30. The liquid supply unit 5 supplies the temperature-controlled liquid to the space between the wafer W and the end portion 4A of the optical element 4 via at least one of the supply tubes 21, 22, 27, 28. The liquid recovery unit 6 recovers the liquid supplied onto the wafer W via at least one of the recovery tubes 23, 24, 29, 30.

Next, an explanation will be made about a supply method and a recovery method for the liquid 7.

With reference to FIG. 2, when the wafer W is subjected to the stepping movement in the direction of the arrow 25A indicated by the solid line (−X direction), the liquid supply unit 5 supplies the liquid 7 to the space between the wafer W and the end portion 4A of the optical element 4 via the supply tube 21 and the discharge nozzle 21a. The liquid recovery unit 6 recovers the liquid 7 from the surface of the wafer W via the recovery nozzle 23 and the inflow nozzles 23a, 23b. In this situation, the liquid 7 flows in the direction of the arrow 25B (−X direction) on the wafer W. The space between the wafer W and the optical element 4 is filled with the liquid 7 in a stable state.

On the other hand, when the wafer W is subjected to the stepping movement in the direction of the arrow 26A indicated by the two-dot chain line (+X direction), then the liquid supply unit 5 supplies the liquid 7 to the space between the wafer W and the end portion 4A of the optical element 4 by using the supply tube 22 and the discharge nozzle 22a, and the liquid recovery unit 6 recovers the liquid 7 by using the recovery tube 24 and the inflow nozzles 24a, 24b. In this situation, the liquid 7 flows in the direction of the arrow 26B (+X direction) on the wafer W. The space between the wafer W and the optical element 4 is filled with the liquid 7 in a stable state. As described above, the projection exposure apparatus of this embodiment is provided with the two sets of the discharge nozzles and the inflow nozzles which are inverted to one another in the X direction. Therefore, even when the wafer W is moved in any one of the +X direction and the −X direction, the space between the wafer W and the optical element 4 can be filled with the liquid 7 in the stable state.

In the exposure apparatus of this embodiment, the liquid 7 flows on the wafer W. Therefore, even when any foreign matter is adhered onto the wafer W, the foreign matter can be washed out with the liquid 7. The liquid 7 is adjusted to have a predetermined temperature by the liquid supply unit 5. Therefore, the surface of the wafer W is temperature-adjusted, and it is possible to avoid the decrease in the overlay accuracy or the like which would be otherwise caused by the thermal expansion of the wafer brought about by the heat generated during the exposure. Therefore, even when a certain period of time is required from the alignment to the exposure as in the EGA (enhanced global alignment) system, it is possible to avoid the decrease in the overlay accuracy which would be otherwise caused by the thermal expansion of the wafer possibly brought about during such a period. In the projection exposure apparatus of this embodiment, the liquid 7 flows in the same direction as the direction in which the wafer W is moved. Therefore, the liquid, which has absorbed the foreign matter and the heat, can be recovered without allowing the liquid to stay on the exposure area disposed just under the end portion 4A of the optical element 4.

When the wafer W is subjected to the stepping movement in the Y direction, the liquid 7 is supplied and recovered in the Y direction. That is, when the wafer is subjected to the stepping movement in the direction of the arrow 31A (−Y direction) indicated by the solid line in FIG. 3, then the liquid supply unit 5 supplies the liquid via the supply tube 27 and the discharge nozzle 27a, and the liquid recovery unit 6 recovers the liquid by using the recovery tube 29 and the inflow nozzles 29a, 29b. Accordingly, the liquid flows in the direction of the arrow 31B (−Y direction) on the exposure area disposed just under the end portion 4A of the optical element 4. When the wafer is subjected to the stepping movement in the direction of the arrow 33A (+Y direction) indicated by the two-dot chain line, the liquid is supplied and recovered by using the supply tube 28, the discharge nozzle 28a, the recovery tube 30, and the inflow nozzles 30a, 30b. Accordingly, the liquid flows in the direction of the arrow 33B (+Y direction) on the exposure area disposed just under the end portion 4A. Therefore, even when the wafer W is moved in any one of the +Y direction and the −Y direction, the space between the wafer W and the end portion 4A of the optical element 4 can be filled with the liquid 7 in a stable state, in the same manner as in the case in which the wafer W is moved in the X direction.

There is no limitation to the provision of the nozzles for supplying and recovering the liquid 7 in the X direction and/or the Y direction. It is also allowable to provide nozzles for supplying and recovering the liquid 7, for example, in oblique directions.

Figure 4:
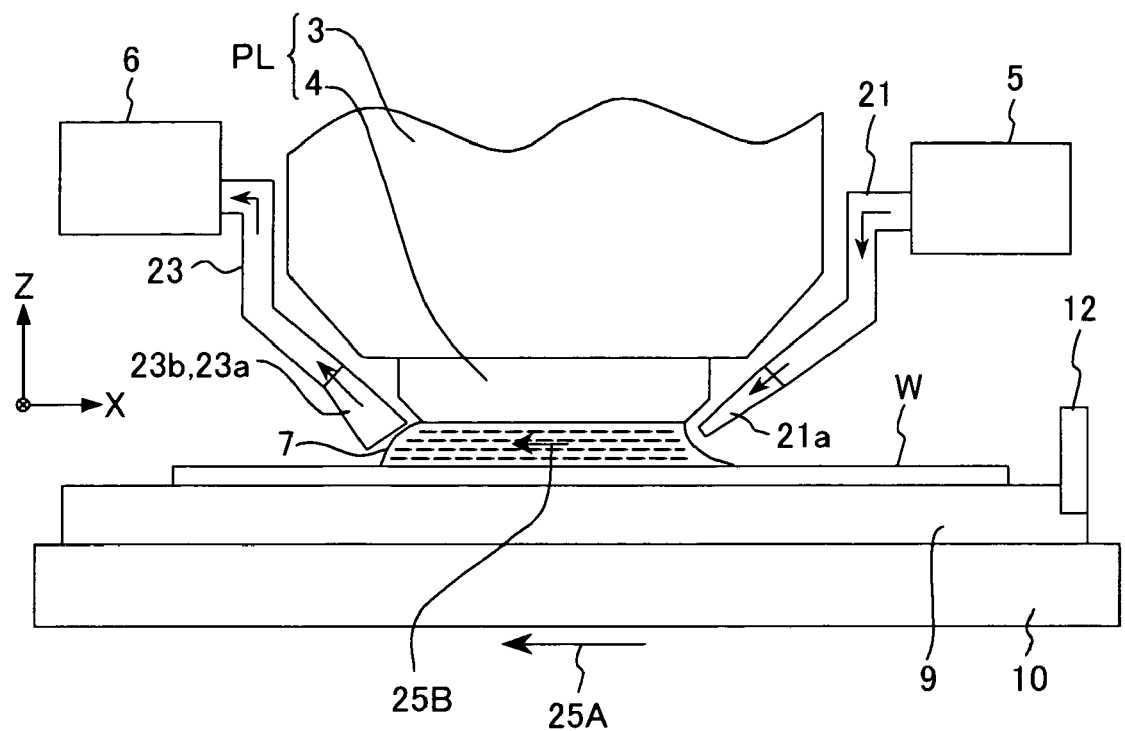
FIG. 4 shows a magnified view illustrating major parts to depict a situation of the supply and the recovery of the liquid 7 with respect to the space between the optical element 4 and a wafer W shown in FIG. 1.

Next, an explanation will be made about a method for controlling the supply amount and the recovery amount of the liquid 7. FIG. 4 shows a situation in which the liquid is supplied to and recovered from the space between the wafer W and the optical element 4 of the projection optical system PL. With reference to FIG. 4, the wafer W is moved in the direction of the arrow 25A (−X direction). The liquid 7, which is supplied by the discharge nozzle 21a, flows in the direction of the arrow 25B (−X direction), and the liquid 7 is recovered by the inflow nozzles 23a, 23b. In order to maintain a constant amount of the liquid 7 existing between the optical element 4 and the wafer W even during the movement of the wafer W, the supply amount Vi (m³/s) of the liquid 7 is equal to the recovery amount Vo (m³/s) thereof in this embodiment. Further, the supply amount Vi and the recovery amount Vo of the liquid 7 are adjusted to be proportional to the movement velocity v of the XY stage (wafer W). That is, the main control system 14 determines the supply amount Vi and the recovery amount Vo of the liquid 7 in accordance with the following expression.

$$Vi = Vo = D \cdot v \cdot d \tag{3}$$

In this expression, as shown in FIG. 1, D represents the diameter (m) of the end portion of the optical element 4, v represents the movement velocity (m/s) of the XY stage, and d represents the working distance (distance between the lowermost surface of the optical element 4 and the surface of the wafer W) (m) of the projection optical system PL. The velocity v, at which the XY stage 10 is subjected to the stepping movement, is set by the main control system 14. D and d are previously inputted into (stored in) the main control system 14. Therefore, when the supply amount Vi of the liquid 7 and the recovery amount Vo thereof are adjusted on the basis of the expression (3), a state is given, in which the space between the wafer W and the optical element 4 shown in FIG. 4 is always filled with the liquid 7.

It is desirable that the working distance d of the projection optical system PL is made as narrow as possible in order that the liquid 7 stably exists between the projection optical system PL and the wafer W. However, if the working distance d is too small, it is feared that the surface of the wafer W may make contact with the optical element 4. Therefore, it is necessary to provide a margin to some extent. Accordingly, the working distance d is set to be, for example, about 2 mm.

Next, a third embodiment of the present invention will be explained with reference to FIGS. 5 to 7. In this embodiment, the optical element of the embodiment described above is applied to a projection exposure apparatus based on the step-and-scan system.

Figure 5:
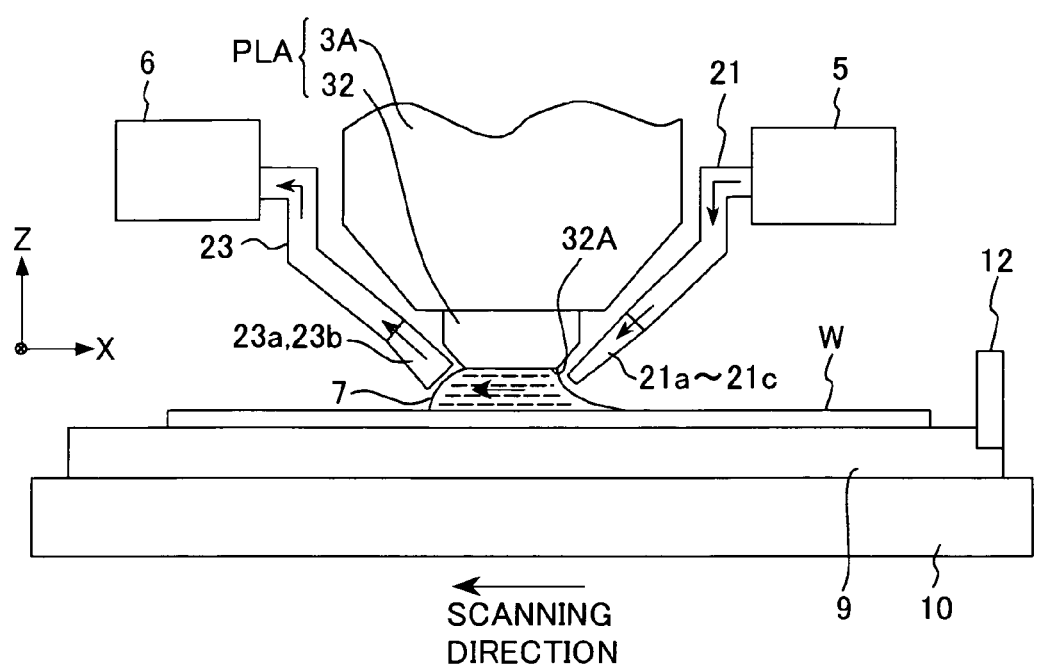
FIG. 5 shows a front view illustrating, for example, a lower end portion of a projection optical system PLA of a projection exposure apparatus, a liquid supply unit 5, and a liquid recovery unit 6 to be used in a second embodiment of the present invention.

FIG. 5 shows a front view illustrating, for example, a lower portion of a projection optical system PLA of the projection exposure apparatus of this embodiment, a liquid supply unit 5, and a liquid recovery unit 6. The same or equivalent constitutive components as those shown in FIG. 4 are designated by the same reference numerals. With reference to FIG. 5, an optical element 32, which is disposed at a lowermost end of a barrel 3A of the projection optical system PLA, has an end portion 32A which is formed so that the end portion has a rectangular shape which is long in the Y direction (non-scanning direction) and which has a necessary portion for the scanning exposure. The optical element 32 is such an optical element that a corrosion resistant film, which is equivalent to that of the optical element produced in the first embodiment, is provided on a fluorite base. During the scanning exposure, a part of a pattern image of the reticle is projected onto a rectangular exposure area disposed just under the end portion 32A. The reticle (not shown) is moved at a velocity V in the −X direction (or in the +X direction) with respect to the projection optical system PLA, in synchronization with which the wafer W is moved at a velocity β·V (β represents the projection magnification) in the +X direction (or in the −X direction) by the aid of the XY stage 10. After the exposure is completed for one shot area, the next shot area is moved to the scanning start position in accordance with the stepping of the wafer W. In the following procedure, the exposure is successively performed for respective shot areas in the step-and-scan manner.

The liquid immersion method is also applied in this embodiment, and thus the space between the optical element 32 and the surface of the wafer W is filled with the liquid 7 during the scanning exposure. The liquid 7 is supplied and recovered by using the liquid supply unit 5 and the liquid recovery unit 6 respectively in the same manner as in the second embodiment.

Figure 6:
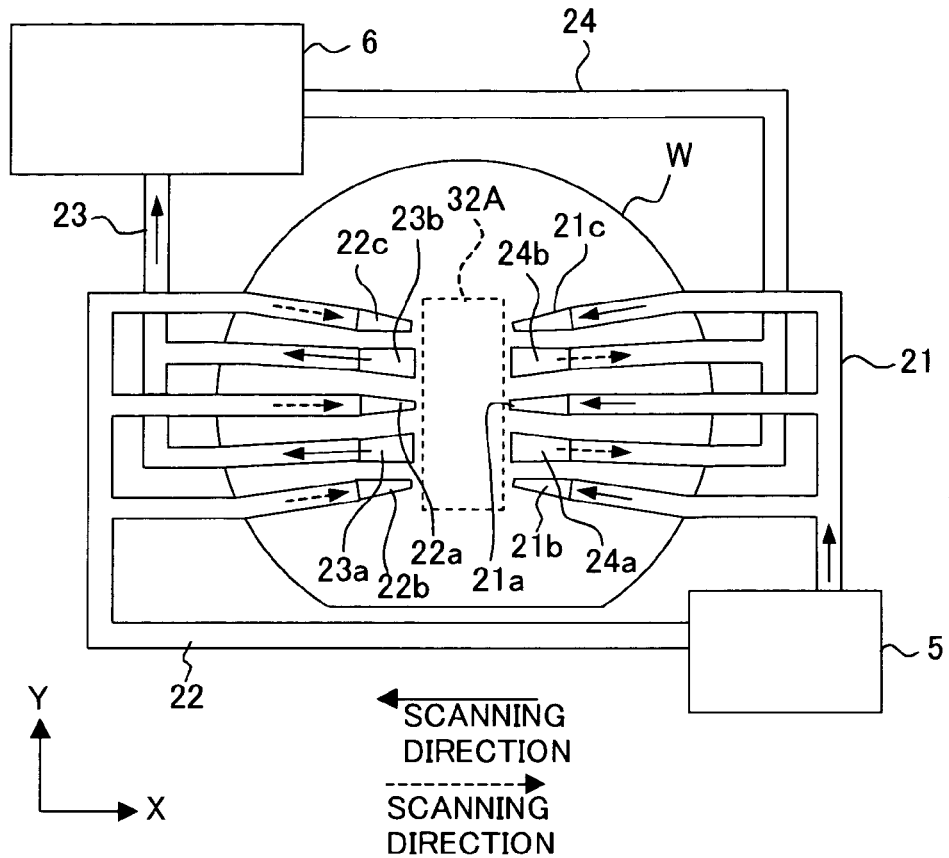
FIG. 6 shows a positional relationship between an end portion 32A of an optical element 32 of the projection optical system PLA shown in FIG. 5 and discharge nozzles and inflow nozzles for the X direction.

FIG. 6 shows a positional relationship between the end portion 32A of the optical element 32 of the projection optical system PLA and the discharge nozzles and the inflow nozzles for supplying and recovering the liquid 7 in the X direction. With reference to FIG. 6, the end portion 32A of the optical element 32 has a rectangular shape which is long in the Y direction. The three discharge nozzles 21a to 21c are arranged on the side in the +X direction, and the two inflow nozzles 23a, 23b are arranged on the side in the −X direction so that the end portion 32A of the optical element 32 of the projection optical system PLA is interposed in the X direction.

The discharge nozzles 21a to 21c are connected to the liquid supply unit 5 via a supply tube 21, and the inflow nozzles 23a, 23b are connected to the liquid recovery unit 6 via a recovery tube 23. The discharge nozzles 22a to 22c and the recovery nozzles 24a, 24b are arranged at positions obtained by rotating the positions of the discharge nozzles 21a to 21c and the recovery nozzles 23a, 23b by substantially 180° about the center of the end portion 32A. The discharge nozzles 21a to 21c and the inflow nozzles 24a, 24b are arranged alternately in the Y direction, and the discharge nozzles 22a to 22c and the inflow nozzles 23a, 23b are arranged alternately in the Y direction. The discharge nozzles 22a to 22c are connected to the liquid supply unit 5 via a supply tube 22, and the inflow nozzles 24a, 24b are connected to the liquid recovery unit 6 via a recovery tube 24.

When the wafer W is moved in the scanning direction (−X direction) indicated by the solid line arrow to perform the scanning exposure, the liquid 7 is supplied and recovered by the liquid supply unit 5 and the liquid recovery unit 6 by using the supply tube 21, the discharge nozzles 21a to 21c, the recovery tube 23, and the inflow nozzles 23a, 23b. The liquid 7 is allowed to flow in the −X direction so that the space between the optical element 32 and the wafer W is filled therewith. When the wafer W is moved in the direction (+X direction) indicated by the two-dot chain line arrow to perform the scanning exposure, the liquid 7 is supplied and recovered by using the supply tube 22, the discharge nozzles 22a to 22c, the recovery tube 24, and the inflow nozzles 24a, 24b. The liquid 7 is allowed to flow in the +X direction so that the space between the optical element 32 and the wafer W is filled therewith. When the direction, in which the liquid 7 is allowed to flow, is switched depending on the scanning direction, the space between the wafer W and the end portion 32A of the optical element 32 can be filled with the liquid 7, even when the wafer W is subjected to the scanning exposure in any one of the +X direction and the −X direction. Accordingly, the exposure can be performed at a high resolution and a wide depth of focus.

The supply amount Vi (m³/s) of the liquid 7 and the recovery amount Vo (m³/s) thereof are determined in accordance with the following expression.

$$Vi=Vo=DSY \cdot v \cdot d \quad (4)$$

In this expression, DSY represents the length (m) of the end portion 32A of the optical element 32 in the X direction. Accordingly, the space between the optical element 32 and the wafer W can be filled with the liquid 7 in a stable state even during the scanning exposure.

The number and the shapes of the nozzles are not specifically limited. For example, the liquid 7 may be supplied and recovered by using two pairs of nozzles for the long side of the end portion 32A. In this case, the discharge nozzles and the inflow nozzles may be arranged while being aligned vertically in order that the liquid can be supplied and recovered in any one of the +X direction and the −X direction.

When the wafer W is subjected to the stepping movement in the Y direction, the liquid 7 is supplied and recovered in the Y direction in the same manner as in the second embodiment.

Figure 7:
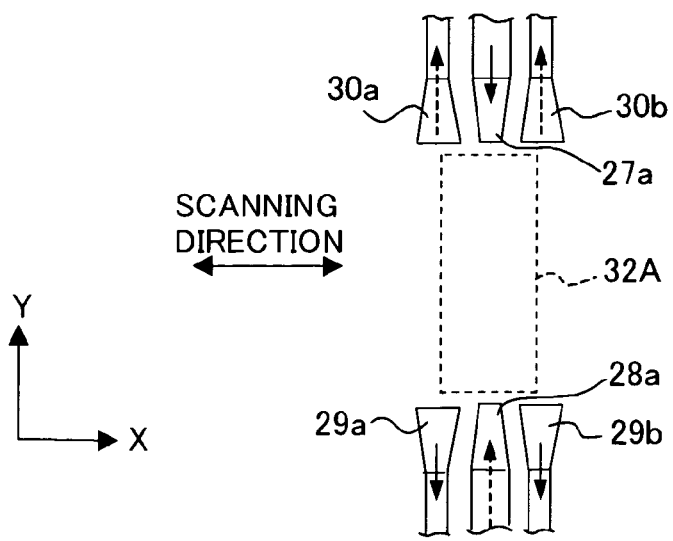
FIG. 7 shows a positional relationship between the end portion 32A of the optical element 32 of the projection optical system PLA shown in FIG. 5 and discharge nozzles and inflow nozzles for supplying and recovering the liquid in the Y direction.

FIG. 7 shows a positional relationship between the end portion 32A of the optical element 32 of the projection optical system PLA and the discharge nozzles and the inflow nozzles for the Y direction. With reference to FIG. 7, when the wafer is subjected to the stepping movement in the non-scanning direction (−Y direction) perpendicular to the scanning direction, the liquid 7 is supplied and recovered by using the discharge nozzle 27a and the inflow nozzles 29a, 29b arranged in the Y direction. When the wafer is subjected to the stepping movement in the +Y direction, the liquid 7 is supplied and recovered by using the discharge nozzle 28a and the inflow nozzles 30a, 30b arranged in the Y direction. The supply amount Vi (m³/s) of the liquid 7 and the recovery amount Vo (m³/s) thereof are determined in accordance with the following expression.

$$Vi=Vo=DSX \cdot v \cdot d \quad (5)$$

In this expression, DSX represents the length (m) of the end portion 32A of the optical element 32 in the Y direction. The space between the optical element 32 and the wafer W can be continuously filled with the liquid 7 by adjusting the supply amount of the liquid 7 depending on the movement velocity v of the wafer W when the stepping movement is performed in the Y direction as well, in the same manner as in the second embodiment.

As described above, when the wafer W is moved, the liquid is allowed to flow in the direction corresponding to the direction of the movement. Accordingly, the space between the wafer W and the end portion of the projection optical system PL can be continuously filled with the liquid 7.

The liquid, which is usable as the liquid 7 in the embodiments described above, is not specifically limited to pure water. It is possible to use liquids (for example, cedar oil) which have the transmittance with respect to the exposure light beam, which have the refractive index as high as possible, and which are stable against the photoresist coated to the surface of the wafer and the projection optical system.

It is a matter of course that the present invention is not limited to the embodiments described above, which may be embodied in other various forms without deviating from the gist or essential characteristics of the present invention.

The base of the optical element of the present invention is lens-shaped. However, there is no limitation thereto. It is also allowable to use those each of which is formed as a film on a fluorite plate-shaped base as a cover glass to be disposed between the liquid and the conventional fluorite lens.

According to the projection exposure apparatus of the present invention, the end portion of the projection optical system is not corroded by the liquid. Therefore, the operation of the apparatus is not stopped in order to exchange the corroded optical element. Accordingly, it is possible to efficiently produce final products having fine patterns. Further, the optical characteristics of the optical element of the present invention are stable, because the optical element is not corroded. When the projection exposure apparatus, which carries the optical element of the present invention, is used, it is possible to produce final products having stable qualities.

What is claimed is:

1. An optical element usable for a projection optical system which exposes a substrate by projecting a predetermined pattern onto the substrate, the optical element comprising:
   a base of the optical element which is installed to an end of the projection optical system on a side of the substrate and through which the exposure is performed in a state that a liquid is maintained between the optical element and the substrate; and
   a corrosion resistant film, which is a $SiO_2$ film and which is formed directly on at least a part of a surface of the base of the optical element to avoid corrosion of the base by the liquid, the optical element contacting with the liquid.

2. The optical element according to claim 1, wherein the base of the optical element is fluorite.

3. The optical element according to claim 1, wherein a light beam, which is used for the exposure, is an ArF laser beam.

4. The optical element according to claim 1, wherein the liquid is pure water.

5. An exposure apparatus which exposes a substrate by projecting an image of a predetermined pattern onto the substrate through a liquid, the exposure apparatus comprising:
   a projection optical system which projects the image of the pattern onto the substrate;
   an optical element which is installed to an end of the projection optical system on a side of the substrate; and
   an apparatus which supplies the liquid to a space between the optical element and the substrate, wherein:
   the optical element includes a base, and a corrosion resistant film, which is a $SiO_2$ film and which is provided directly on at least a part of a surface of the base to avoid corrosion of the base by the liquid, the optical element contacting with the liquid.

6. The exposure apparatus according to claim 5, wherein the corrosion resistant film is a multilayer oxide film.

7. The exposure apparatus according to claim 5, wherein the base of the optical element is fluorite.

8. The exposure apparatus according to claim 7, wherein a light beam, which is used for the exposure, is an ArF laser beam.

9. The exposure apparatus according to claim 5, wherein the liquid is pure water.

10. An optical element used for a liquid immersion exposure apparatus which exposes a substrate with an exposure beam via the optical element and a liquid, the optical element comprising:
    a base; and
    a member which includes a corrosion resistant film, the corrosion resistant film being a $SiO_2$ film provided directly on a surface of the base and which prevents the base from contacting with the liquid to avoid corrosion of the base by the liquid, the optical element contacting with the liquid,
    wherein the optical element makes contact with the liquid when the substrate is exposed with the exposure beam via the optical element and the liquid.

11. The optical element according to claim 10, wherein the corrosion resistant film includes a multi-layer film.

12. The optical element according to claim 11, wherein the multi-layer film has at least one layer which has a corrosion resistance.

13. The optical element according to claim 11, wherein an outermost layer of the multi-layer film has a corrosion resistance.

14. The optical element according to claim 11, wherein each of layers included in the multi-layer film has a corrosion resistance.

15. The optical element according to claim 11, wherein the multi-layer film has at least one oxide layer which has a corrosion resistance.

16. The optical element according to claim 11, wherein the multi-layer film has an anti-reflection function as a whole.

17. The optical element according to claim 10, wherein the corrosion resistant film has a thickness of 50 to 2000 angstrom.

18. The optical element according to claim 10, wherein the corrosion resistant film has a corrosion resistance against pure water.

19. The optical element according to claim 10, wherein the exposure beam passes through the member.

20. The optical element according to claim 19, wherein the exposure beam passes through a light-outgoing surface of the optical element.

21. The optical element according to claim 20, wherein the exposure beam passed through the base is incident on the member, and the exposure beam passed through the member is incident on the liquid.

22. The optical element according to claim 10, wherein the member is provided on a liquid side with respect to the base.

23. The optical element according to claim 22, wherein the member makes contact with the liquid.

24. The optical element according to claim 22, wherein the member is provided on the base.

25. The optical element according to claim 10, wherein the member makes contact with the liquid.

26. The optical element according to claim 25, wherein the exposure beam passes through the member.

27. The optical element according to claim 25, wherein the exposure beam passes through a light-outgoing surface of the optical element.

28. The optical element according to claim 10, wherein the member is provided on the base.

29. The optical element according to claim 10, wherein the member is disposed on at least a tip portion of the base.

30. The optical element according to claim 10, wherein the member is provided on a surface of the base which contacts with the liquid.

31. The optical element according to claim 10, wherein the base is a lens-shaped base.

32. The optical element according to claim 10, wherein the base is a plate-shaped base.

33. An optical system used for a liquid immersion exposure apparatus, comprising the optical element as defined in claim 10.

34. A liquid immersion exposure apparatus comprising an optical element as defined in claim 10.

35. A liquid immersion exposure apparatus which exposes a substrate with an exposure beam through a liquid, the apparatus comprising:
  an optical element including a base; and a member which includes a corrosion resistant film, the corrosion resistant film being a SiO$_2$ film provided directly on a surface of the base and which prevents the base from contacting with the liquid to avoid corrosion of the base by the liquid, the optical element contacting with the liquid,
  wherein the optical element contacts with the liquid when the substrate is exposed with the exposure beam via the optical element and the liquid.

36. The liquid immersion exposure apparatus according to claim 35, further comprising a liquid supply member having a liquid supply outlet for supplying the liquid, wherein the substrate is moved relative to the liquid supply member.

37. The liquid immersion exposure apparatus according to claim 35, wherein the corrosion resistant film includes a multi-layer film.

38. The liquid immersion exposure apparatus according to claim 37, wherein the multi-layer film has at least one layer which has a corrosion resistance.

39. The liquid immersion exposure apparatus according to claim 37, wherein an outermost layer of the multi-layer film has a corrosion resistance.

40. The liquid immersion exposure apparatus according to claim 37, wherein the multi-layer film has at least one oxide layer which has a corrosion resistance.

41. The liquid immersion exposure apparatus according to claim 35, wherein the beam passed through the base is incident on the member, and the beam passed through the member is incident on the liquid.

42. The liquid immersion exposure apparatus according to claim 35, wherein the member is provided on a liquid side with respect to the base and makes contact with the liquid.

43. The liquid immersion exposure apparatus according to claim 35, wherein the member makes contact with the liquid.

44. The liquid immersion exposure apparatus according to claim 43, wherein the exposure beam passes through a light-outgoing surface of the optical element.

45. The liquid immersion exposure apparatus according to claim 35, wherein the member is provided on the base.

46. A method for producing an optical element used for a liquid immersion exposure apparatus, comprising:
  providing a base; and
  providing a member which includes a corrosion resistant film, the corrosion resistant film being a SiO$_2$ film provided directly on a surface of the base, and which prevents any portion of the base from contacting with the liquid, the optical element contacting with the liquid.

47. The method according to claim 46, wherein the member is formed by a film forming method which is one of a sputtering method, an ion beam assist method, an ion plating method and a heating vapor deposition method.

48. A method for producing an optical element used for a liquid immersion exposure apparatus, comprising:
  providing a lens-shaped base; and
  providing a member which includes a corrosion resistant film, the corrosion resistant film being a SiO$_2$ film provided directly on a surface of the base and which prevents any portion of the base from contacting with the liquid, the optical element contacting with the liquid.

49. A method for producing an optical element used for a liquid immersion exposure apparatus, comprising:
  providing a plate-shaped base; and
  providing a member which includes a corrosion resistant film, the corrosion resistant film being a SiO$_2$ film provided directly on a surface of the base and which prevents any portion of the base from contacting with the liquid, the optical element contacting with the liquid.

50. A method for producing a liquid immersion exposure apparatus which exposes a substrate with an exposure beam through a liquid, comprising:
  providing an optical element including a base and a member which includes a corrosion resistant film, the corrosion resistant film being a SiO$_2$ film provided directly on a surface of the base and which prevents any portion of the base from contacting with the liquid, the optical element contacting with the liquid; and
  providing a projection optical system in which the optical element is installed.

* * * * *